(12) United States Patent
Inui

(10) Patent No.: US 8,670,490 B2
(45) Date of Patent: Mar. 11, 2014

(54) SIGNAL TRANSMISSION APPARATUS

(75) Inventor: Fumihiro Inui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 52 days.

(21) Appl. No.: 12/758,624

(22) Filed: Apr. 12, 2010

(65) Prior Publication Data

US 2010/0296602 A1 Nov. 25, 2010

(30) Foreign Application Priority Data

May 25, 2009 (JP) ................. 2009-125848

(51) Int. Cl.
*H04B 14/06* (2006.01)
*H04B 1/707* (2011.01)

(52) U.S. Cl.
USPC ........................................ 375/247

(58) Field of Classification Search
USPC .................. 375/140, 141, 146, 147, 247, 248
See application file for complete search history.

(56) References Cited

U.S. PATENT DOCUMENTS

| 5,528,239 A | 6/1996 | Swanson et al. ............... 341/143 |
| 5,835,042 A | 11/1998 | Ichimura et al. ............... 341/143 |
| 7,443,324 B1 * | 10/2008 | Muhammad ................... 341/131 |
| 7,564,442 B2 | 7/2009 | Hatano et al. ................. 345/100 |
| 2002/0145550 A1 * | 10/2002 | Korkala ......................... 341/131 |
| 2004/0132488 A1 * | 7/2004 | Hidehiro et al. ............ 455/552.1 |
| 2004/0213333 A1 * | 10/2004 | Huang et al. .................. 375/150 |
| 2009/0174800 A1 | 7/2009 | Hatano et al. ................. 348/302 |

FOREIGN PATENT DOCUMENTS

| JP | 6-021824 A | 1/1994 |
| JP | 9-186728 A | 7/1997 |
| JP | 10-145232 A | 5/1998 |
| JP | 10-233687 | 9/1998 |
| JP | 2000-22593 A | 1/2000 |

* cited by examiner

*Primary Examiner* — Kevin Kim
(74) *Attorney, Agent, or Firm* — Fitzpatrick, Cella, Harper & Scinto

(57) ABSTRACT

A signal transmission apparatus that transmits a 1-bit signal obtained by delta-sigma modulation is provided. In the signal transmission apparatus, a pseudo-random noise pattern having a data rate equal to that of the delta-sigma modulated 1-bit signal is generated, and the 1-bit signal is code-modulated using the generated pseudo-random noise pattern. The generated pseudo-random noise pattern and the code-modulated signal obtained through code modulation are transmitted via a transmission line. The transmitted code-modulated signal is demodulated using the transmitted pseudo-random noise pattern.

12 Claims, 11 Drawing Sheets

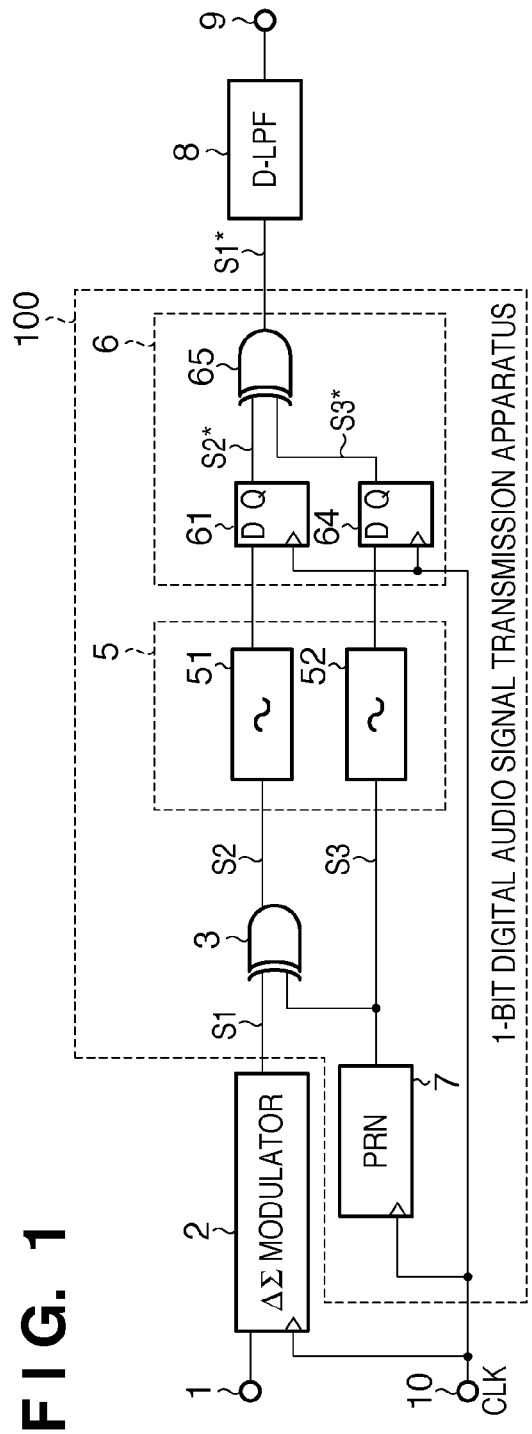
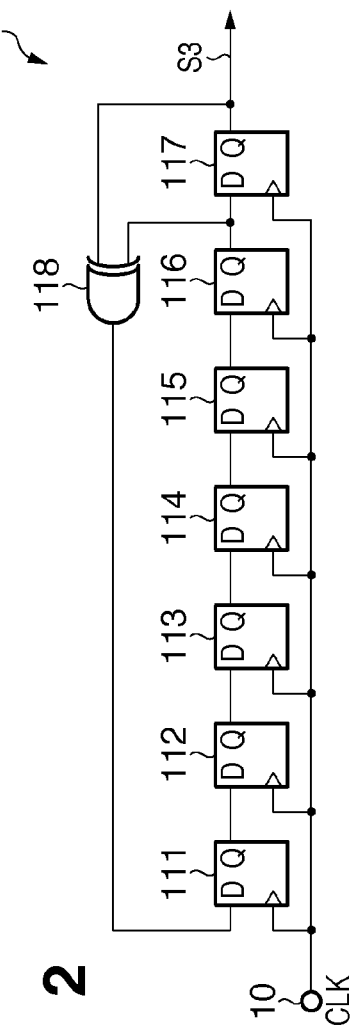
FIG. 1
FIG. 2

SIGNAL TRANSMISSION APPARATUS

BACKGROUND OF THE INVENTION

1. Field of the Invention

The present invention relates to a signal transmission apparatus, and more particularly to a signal transmission apparatus that is suitable for transmitting a delta-sigma modulated 1-bit signal.

2. Description of the Related Art

Recent portable electronic devices such as DVCs (digital video cameras) and DSCs (digital still cameras) have a variety of functions including, in addition to a moving image capturing function, a still image capturing function and an audio recording function, a function of playing back captured images and recorded sound, a function of editing captured images and recorded sound, a data transfer function, and so on. On the other hand, in order to achieve a high level of portability, a large number of electronic components are disposed in a very limited space of such an electronic device. Accordingly, they must be mounted in a very dense configuration employing a multilayer wiring board and fine patterns, and wiring patterns that connect the electronic components are disposed close to each other. Taking measures against noise resulting from crosstalk between such closely arranged wiring patterns is one of the major challenges when designing such portable electronic devices.

For example, an audio function may have a problem in that a transmission line that transmits a 1-bit digital audio signal output from a delta-sigma modulator and a digital circuit that drives the transmission line affect analog signals and clock signals. Delta-sigma modulators are often used for audio signal processing because they have a high level of dynamic range properties in the audio signal band and provide a 1-bit digital output, which can be easily transmitted.

On the other hand, the low-frequency component of the 1-bit digital audio signal that is output from the delta-sigma modulator is an analog audio signal. Accordingly, noise generated in the transmission line and the digital circuit that drives the transmission line, which is highly correlated with the analog audio signal, causes deterioration in sound quality when the noise is mixed with an analog input signal or sampling clock signal.

To address such a problem, Japanese Patent Laid-Open No. 9-186728 teaches that the reverse phase signal of a 1-bit digital audio signal is multiplexed by using a data rate that is double that of the 1-bit digital audio signal and transmitted, whereby the analog audio signal component included in the 1-bit digital audio signal is cancelled.

In addition, Japanese Patent Laid-Open No. 6-021824 teaches that a 1-bit digital audio signal is RTZ (return-to-zero) coded, to which the reverse phase signal is then added, so as to obtain equal numbers of logical ones for each digital state output to a transmission line, whereby the pattern of a transient current that occurs on the power source can be made independent of the 1-bit digital audio signal, and noise components from the transmission line and the digital circuit are cancelled.

However, with Japanese Patent Laid-Open No. 9-186728, the output signal synchronized with the leading edge of a sampling clock is still highly correlated with analog signals. Accordingly, there is a possibility that the sound quality might be deteriorated when noise synchronized with the clock is introduced into the sampling clock signal.

In addition, with Japanese Patent Laid-Open No. 6-021824, separate transmission lines, a positive phase signal transmission line and a reverse phase signal transmission line, are provided, and therefore the crosstalk between closely arranged wiring patterns is not completely cancelled.

Furthermore, with Japanese Patent Laid-Open Nos. 9-186728 and 6-021824, the number of transition points of digital output is double that of the output from the delta-sigma modulator. Accordingly, these conventional techniques also have a problem in that the power consumption of the digital circuit driving the transmission line is increased.

SUMMARY OF THE INVENTION

The present invention provides a signal transmission apparatus that enables even higher quality digital signal transmission. The present invention also provides a signal transmission apparatus that suppresses an increase in power consumption and enables even higher quality digital signal transmission.

According to one aspect of the present invention, a signal transmission apparatus that transmits a 1-bit signal obtained by delta-sigma modulation includes a generation unit configured to generate a pseudo-random noise pattern having a data rate equal to that of the 1-bit signal, a code modulation unit configured to code-modulate the 1-bit signal using the pseudo-random noise pattern generated by the generation unit, a transmission unit configured to transmit the pseudo-random noise pattern generated by the generation unit and the code-modulated signal obtained by the code modulation unit, and a code demodulation unit configured to demodulate the code-modulated signal transmitted by the transmission unit, using the pseudo-random noise pattern transmitted by the transmission unit.

Further features of the present invention will become apparent from the following description of exemplary embodiments with reference to the attached drawings.

BRIEF DESCRIPTION OF THE DRAWINGS

FIG. 1 is a diagram showing an overall configuration of an audio signal processing system including a signal transmission apparatus according to Embodiment 1.

FIG. 2 is a diagram showing an overall configuration of a code generator according to Embodiment 1.

DESCRIPTION OF THE EMBODIMENTS

Figure 3:
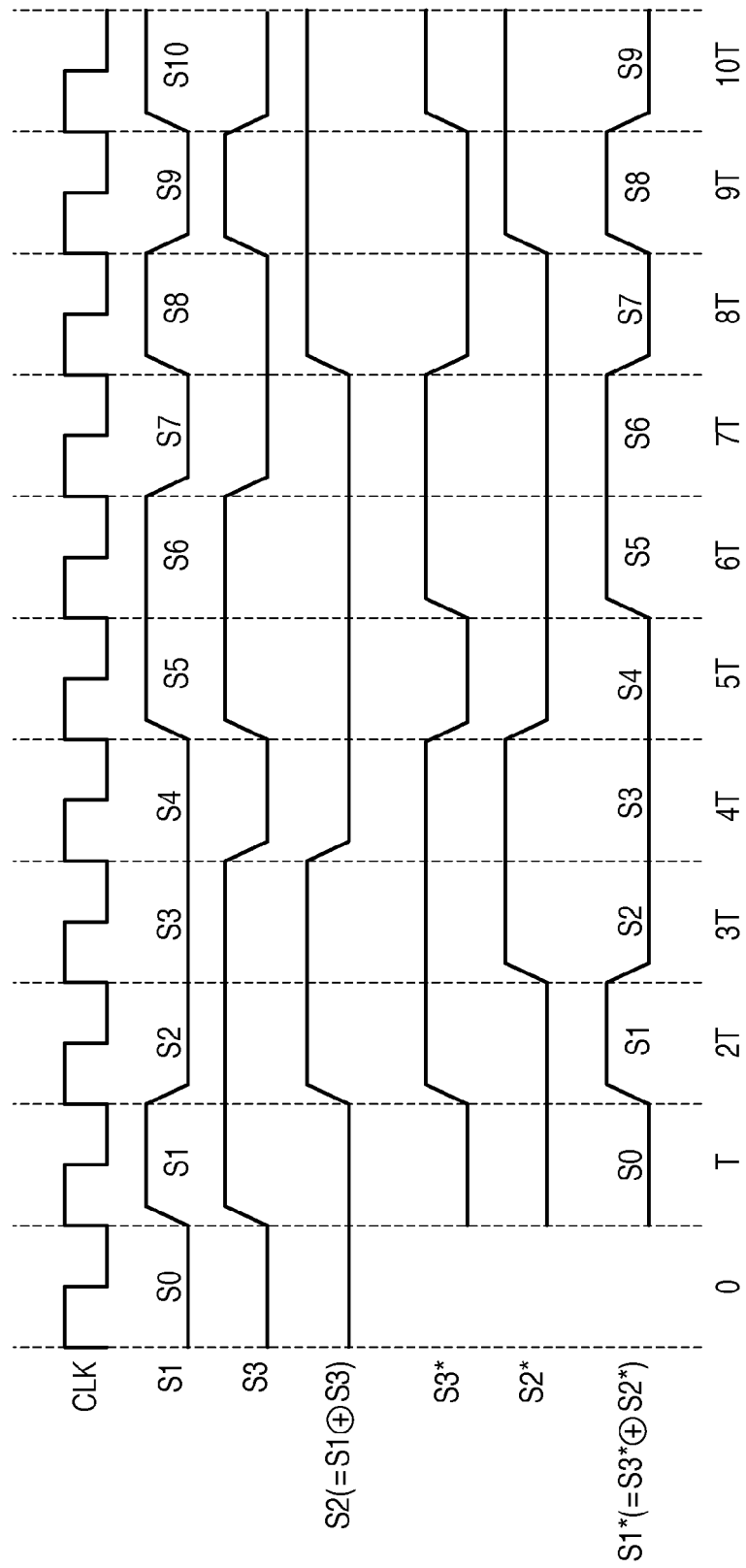
FIG. 3 is a timing diagram illustrating an operation of the audio signal processing system according to Embodiment 1.

FIG. 1 is a diagram showing an overall configuration of an audio signal processing system according to Embodiment 1. This audio signal processing system includes a delta-sigma modulator 2, a 1-bit digital audio signal transmission apparatus 100, and a digital low-pass filter (LPF) 8. The delta-sigma modulator 2 modulates a signal that is input from an analog audio signal input terminal 1 to a 1-bit digital audio signal S1, which is a 1-bit signal, for each period of a clock CLK supplied from a clock input terminal 10.

The 1-bit digital audio signal transmission apparatus 100 includes a code modulator 3, a transmission unit 5, a code demodulator 6 and a code generator 7. The code modulator 3 is made up of, for example, an exclusive OR gate that performs an exclusive OR operation on the 1-bit digital audio signal S1 and a pseudo-random noise (PRN) pattern S3. The code modulator 3 outputs a code-modulated signal S2 by performing the exclusive OR operation on the 1-bit digital audio signal S1 and the pseudo-random noise (PRN) pattern S3. In other words, at each clock cycle, if the 1-bit digital audio signal S1 and the pseudo-random noise pattern S3 are the same, 0 is output. If they are not the same, 1 is output.

The code generator 7 generates a 1-bit pseudo-random noise pattern of 0 or 1 for one clock cycle. The transmission unit 5 includes a transmission line 51 that transmits the code-modulated signal S2 and a transmission line 52 that transmits the pseudo-random noise pattern S3 supplied from the code generator 7. The code demodulator 6 has D-latches 61 and 64 and an exclusive OR gate 65. The D-latch 61 latches the signal that is input via the transmission line 51 in synchronization with the leading edge of the clock pulse to obtain a code-modulated signal S2*. The D-latch 64 latches the signal that is input via the transmission line 52 in synchronization with the leading edge of the clock pulse to obtain a pseudo-random noise pattern S3*. The exclusive OR gate 65 demodulates the signal into a 1-bit digital audio signal S1* using an exclusive OR of the code-modulated signal S2* and the pseudo-random noise pattern S3*. In order to accurately demodulate the 1-bit digital audio signal S1, it is necessary to multiply the signal with the pseudo-random noise pattern in phase with the signal during modulation. In the present embodiment, the synchronization is achieved with the D-latches 61 and 64.

The digital LPF 8 is a digital signal processing unit that converts the transmitted 1-bit digital audio signal to a digital audio signal of an audio format that can be recorded on CD or the like, and outputs the converted signal through a digital audio signal output terminal 9.

An example of the code generator 7 will be described with reference to FIG. 2. The code generator 7 includes a 7-bit shift register in which seven D-flip-flops 111, 112, 113, 114, 115, 116 and 117 are arranged in series by sequentially connecting their input and output. The code generator 7 further includes an exclusive OR gate 118 that receives input of an output Q from the D-flip-flop 116 in the sixth bit and an output Q from the D-flip-flop 117 in the seventh bit, of the shift register. The output of the exclusive OR gate 118 is connected to the input D of the D-flip-flop 111 in the first stage. As the initial value for each D-flip-flop 111, 112, 113, 114, 115, 116, 117, (0, 0, 0, 0, 0, 0, 1) is given, and an output obtained from the D-flip-flop 117 in the seventh stage is taken out for each clock supplied to the shift register. The output pattern thus obtained is used as a pseudo-random noise pattern S3.

An operation of the 1-bit digital audio signal transmission apparatus 100 configured as shown in FIG. 1 will be described with reference to the timing chart of FIG. 3. A 1-bit digital audio signal S1 from the delta-sigma modulator 2 is output in synchronization with a clock CLK supplied from the clock input terminal 10. Likewise, a pseudo-random noise pattern S3 from the code generator 7 is also output in synchronization with the clock CLK supplied from the clock input terminal 10. An exclusive OR of the 1-bit digital audio signal S1 and the pseudo-random noise pattern S3 is produced to obtain a code-modulated signal S2. Then, the code-modulated signal S2 is transmitted via the transmission line 51. In the code-modulated signal S2, the low-frequency component of the 1-bit digital audio signal S1 spreads over a wide frequency band correspondingly to the pseudo-random noise pattern S3, and the power level of the spectrum of the spread 1-bit digital audio signal S1 is suppressed. Accordingly, the conventional problem of signal quality degradation caused by noise in the transmission system due to the low-frequency component of the 1-bit digital audio signal S1 being an analog audio signal component can be prevented.

Figure 4:
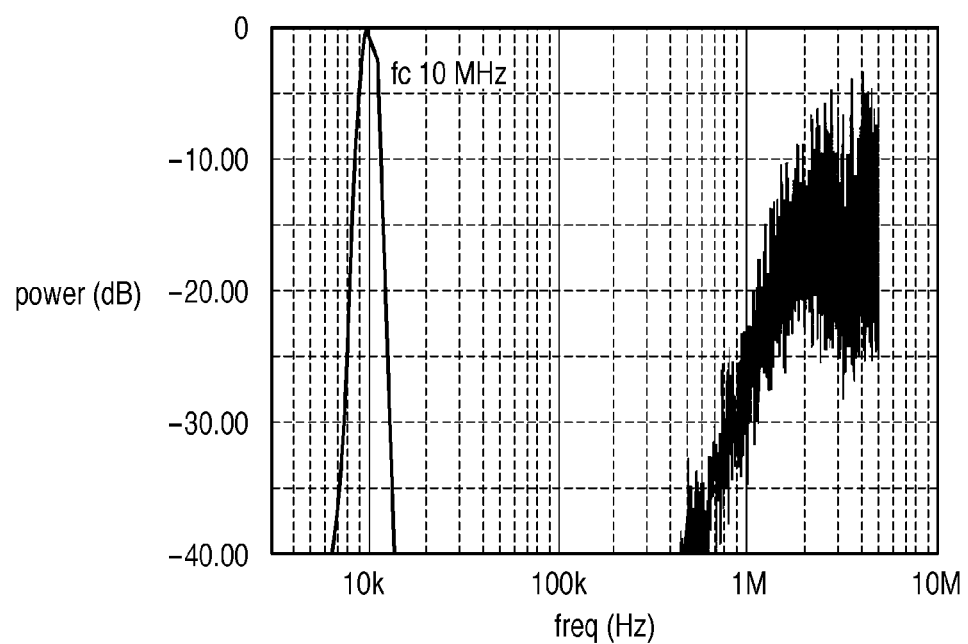
FIG. 4 is a spectrum analysis diagram of a delta-sigma modulated output according to Embodiment 1.
Figure 5:
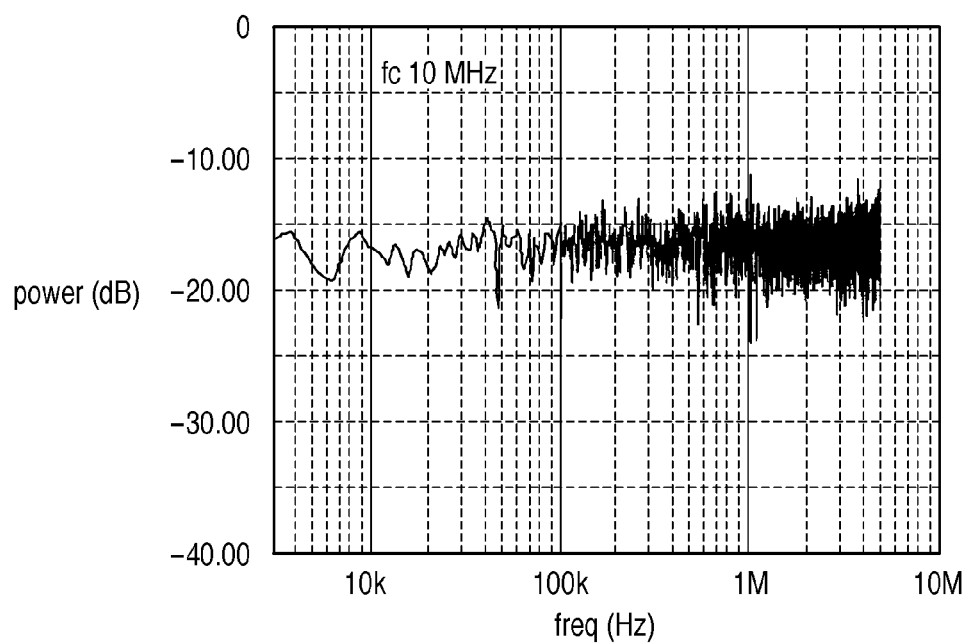
FIG. 5 is a spectrum analysis diagram of a code-modulated signal according to Embodiment 1.

Next, the effects of the 1-bit digital audio signal transmission apparatus 100 will be described with reference to FIGS. 4 and 5. FIG. 4 is a spectrum analysis diagram of a 1-bit digital audio signal obtained by inputting a 10 kHz tone signal and performing delta-sigma modulation. FIG. 5 is a spectrum analysis diagram of a code-modulated signal obtained by code modulating the signal shown in FIG. 4 by using the code generator 7 shown in FIG. 2. It can be seen from the comparison of FIGS. 4 and 5 that the peak observed at 10 kHz in FIG. 4 is suppressed in FIG. 5, which indicates that the low-frequency components of the 1-bit digital audio signal S1 have spread over a wide frequency band correspondingly to the pseudo-random noise pattern S3. In other words, when transmitting a code-modulated 1-bit digital audio signal, the analog audio signal component that flows through the transmission line and the digital circuit that drives the transmission line can be reduced to a low level, enabling high quality digital signal transmission. In addition, because the code-modulated signal S2 that passes through the transmission line has a data rate that is the same as the output rate of delta-sigma modulation, the increase of power consumption due to the digital circuit that drives the transmission line can be suppressed.

Figure 6:
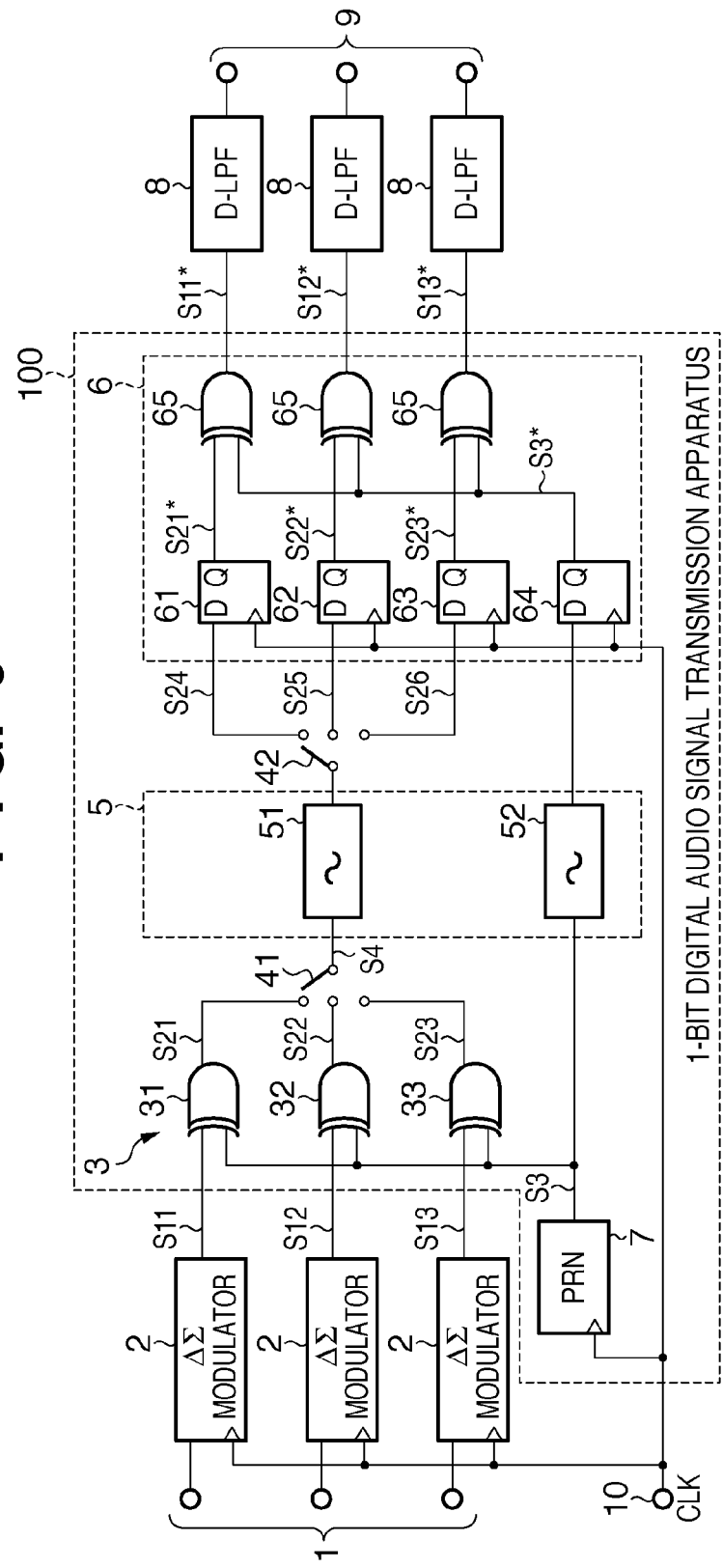
FIG. 6 is a diagram showing an overall configuration of an audio signal processing system according to Embodiment 2.

Next, an audio signal processing system according to Embodiment 2 will be described with reference to FIG. 6. In Embodiment 2, the audio signal processing system includes a plurality of units that code a plurality of 1-bit digital audio signals S11, S12 and S13 obtained from delta-sigma modulators in parallel. Then, the coded signals are multiplexed and transmitted via the transmission line 51. Descriptions of reference numerals already described are omitted here.

The plurality of 1-bit digital audio signals S11, S12 and S13 are converted to code-modulated signals S21, S22 and S23 by exclusive OR gates 31, 32 and 33 included in the code modulator 3. Then, the code-modulated signals S21, S22 and S23 are combined into a single stream, using time division multiplexing, by a parallel-to-serial converter 41, which outputs a multiplex signal S4. The transmission line 51 transmits the multiplex signal S4. A serial-to-parallel converter 42 converts the multiplex signal S4 into a plurality of code-modulated signals S24, S25 and S26. The code-modulated signal S24 is latched by a D-latch 61 in synchronization with the leading edge of the clock pulse, and thereby a code-modulated signal S21* is obtained. Similarly, the code-modulated signals S25 and S26 and a pseudo-random noise pattern S3 are latched by D-latches 62, 63 and 64 in synchronization with the leading edge of the clock pulse. As a result, code-modulated signals S21*, S22* and S23* and a pseudo-random noise pattern S3* synchronized with the clock pulse are obtained, and the signals are then demodulated into 1-bit digital audio signals S11*, S12* and S13* by exclusive OR gates 65, 66 and 67.

Figure 7:
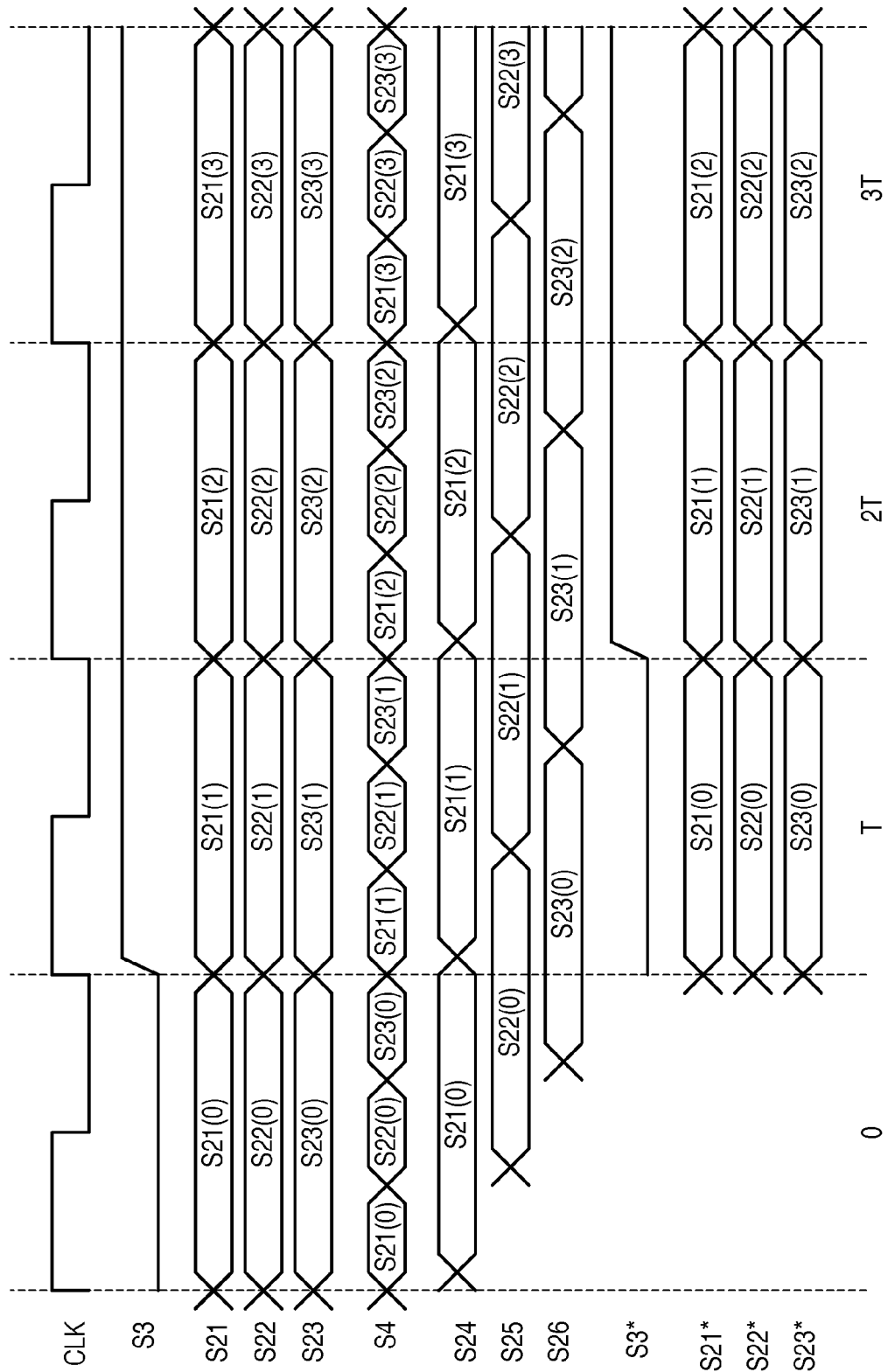
FIG. 7 is a timing diagram illustrating an operation of the audio signal processing system according to Embodiment 2.

Next, the operation will be described in further detail with reference to the timing chart of FIG. 7. A multiplex signal S4 is obtained by sequentially selecting code-modulated signals S21, S22 and S23 that are in synchronization with the leading edge of the clock pulse. After transmission of the multiplex signal S4, a code-modulated signal S24 is obtained by latching in synchronization with a signal S21 included in the multiplex signal S4. Likewise, code-modulated signals S25 and S26 are obtained by latching in synchronization with each of signals S22 and S23 included in the multiplex signal S4. Furthermore, the signals S24, S25 and S26 are latched again in synchronization with the leading edge of the clock pulse to obtain code-modulated signals S21*, S22*, S23* whose phases match each other. The pseudo-random noise pattern S3 is also latched by the D-latch 64 in synchronization with the leading edge of the clock pulse to obtain a pseudo-random noise pattern S3*. At this time, the pseudo-random noise pattern S3* and the code-modulated signals S21*, S22* and S23* are in phase with each other.

In Embodiment 2, the data rate of the signal transmitted through the transmission line 51 is determined by the parallel-to-serial converter 41 based on the number of parallel signals to be multiplexed, and therefore the increase of the data rate can be minimized. As Variation 1 of Embodiment 2, a pseudo-random noise pattern S3 may be multiplexed with a multiplex signal S4.

Variation 1 of Embodiment 2 will be described with reference to FIG. 8. In this variation 1, a plurality of code-modulated signals S21 and S22 and a pseudo-random noise pattern S3 are combined into a single stream by the parallel-to-serial converter 41, and output as a multiplex signal S4. The transmission line 51 transmits the multiplex signal S4. The serial-to-parallel converter 42 converts the multiplex signal S4 into a plurality of code-modulated signals S24 and S25 and a pseudo-random noise pattern S26. The code-modulated signal S24 and S25 and the pseudo-random noise pattern S26 are latched in synchronization with the leading edge of the clock pulse by D-latches 61, 62 and 64. As a result, code-modulated signals S21* and S22* and a pseudo-random noise pattern S3* that are synchronized with the clock pulse are obtained.

Figure 8:
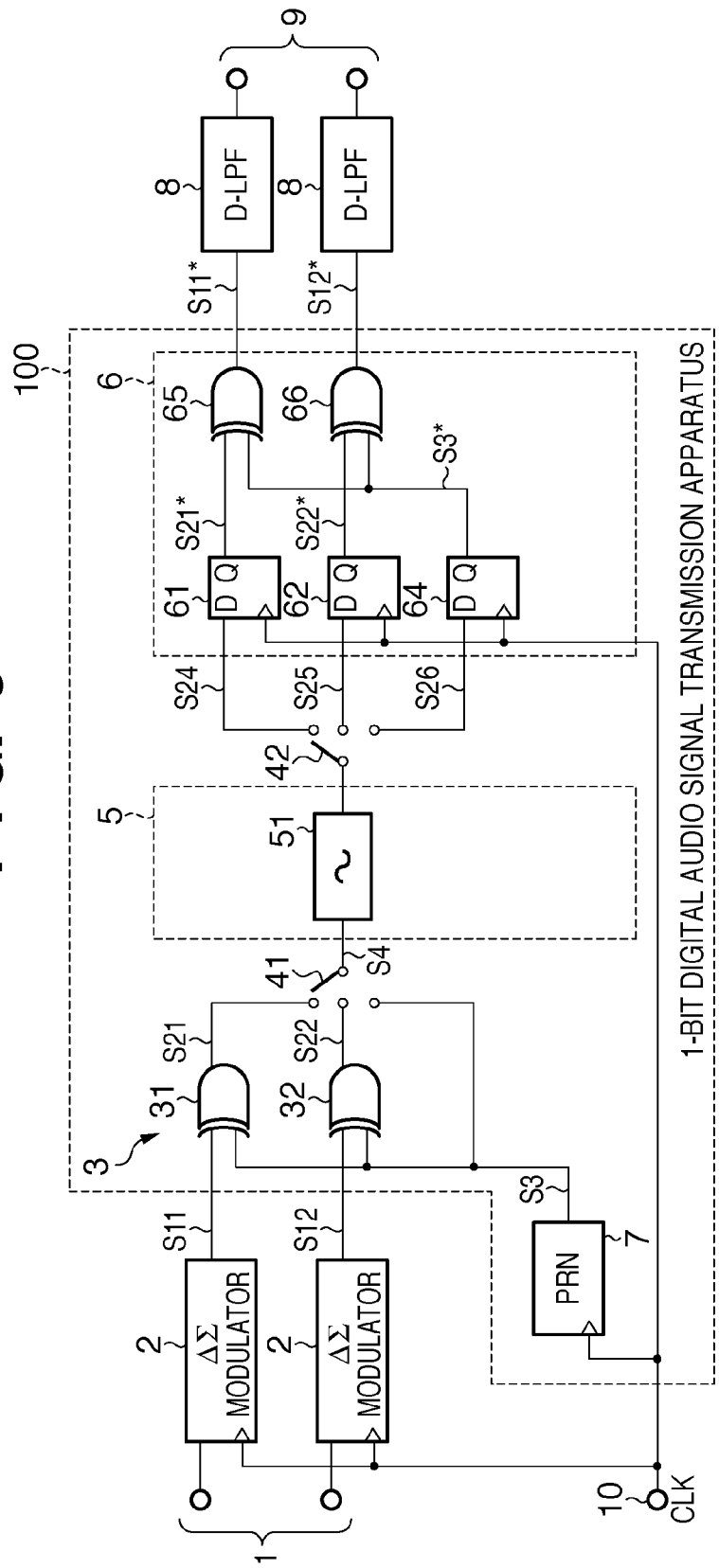
FIG. 8 is a diagram showing an overall configuration of an audio signal processing system according to Variation 1 of Embodiment 2.

FIG. 8 shows, as an example, a configuration in which signals from a plurality of delta-sigma modulators are input in parallel, but the embodiment is not limited thereto. Specifically, it is also possible to employ a configuration in which a signal output from a combination of one delta-sigma modulator and one exclusive OR gate and a signal output from one code generator are multiplexed.

Figure 9:
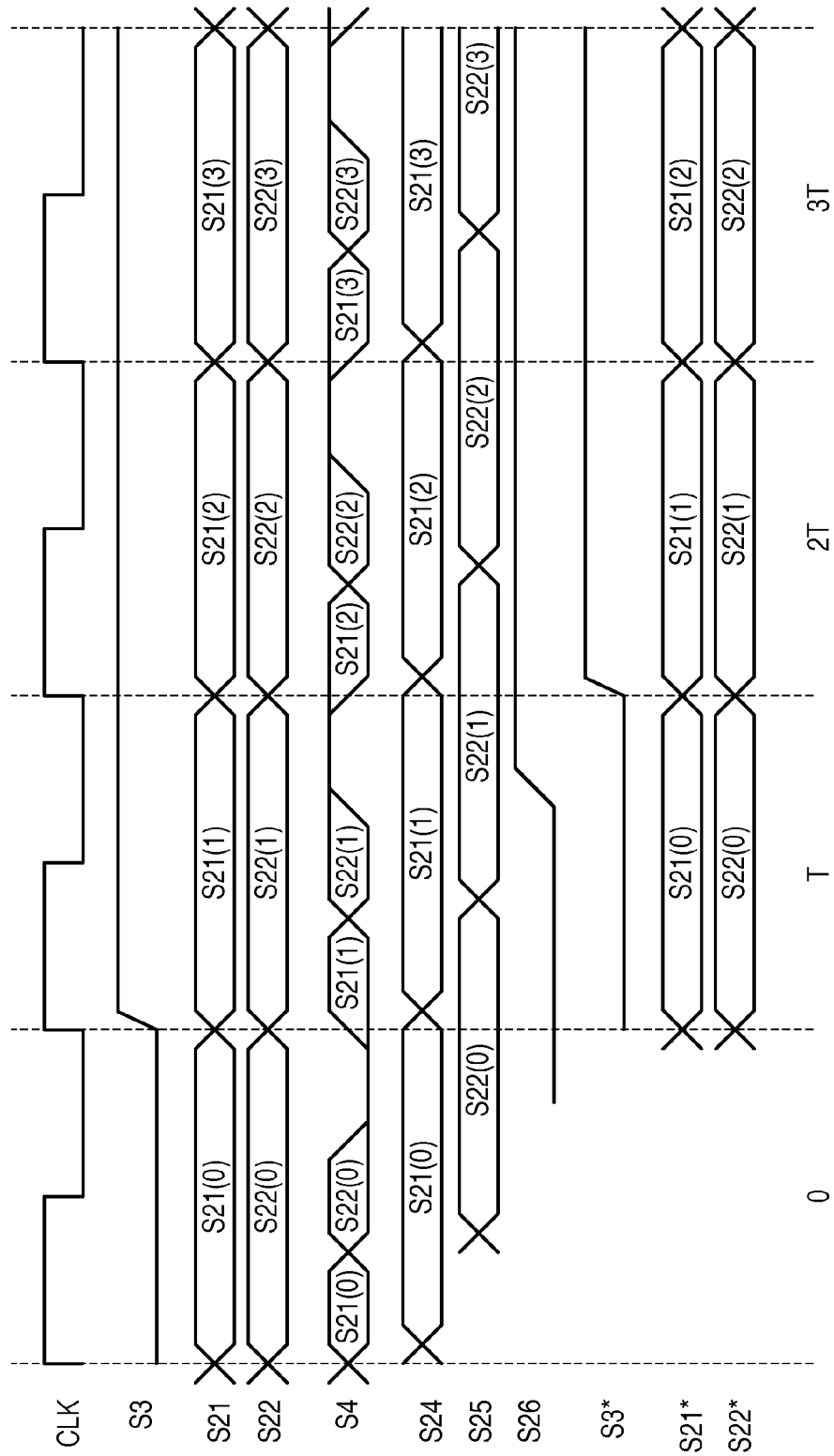
FIG. 9 is a timing diagram illustrating an operation of the audio signal processing system according to Variation 1 of Embodiment 2

Next, the operation will be described in further detail with reference to the timing chart of FIG. 9. A multiplex signal S4 is obtained by sequentially selecting code-modulated signals S21 and S22 and a pseudo-random noise pattern S3 in synchronization with the leading edge of the clock pulse. After transmission of the multiplex signal S4, a code-modulated signal S24 is obtained by latching in synchronization with a signal S21 included in the multiplex signal S4. Likewise, code-modulated signals S25 and S26 are obtained by latching in synchronization with each of a signal S22 and a pseudo-random noise pattern S26 included in the multiplex signal S4. Furthermore, the signals S24, S25 and S26 are latched again in synchronization with the leading edge of the clock pulse to obtain code-modulated signals S21* and S22* and a pseudo-random noise pattern S3* whose phases match each other. In Variation 1, the transmission line 52 that transmits a pseudo-random noise pattern S3 is unnecessary, so it is possible to make the transmission line simpler.

Figure 10:
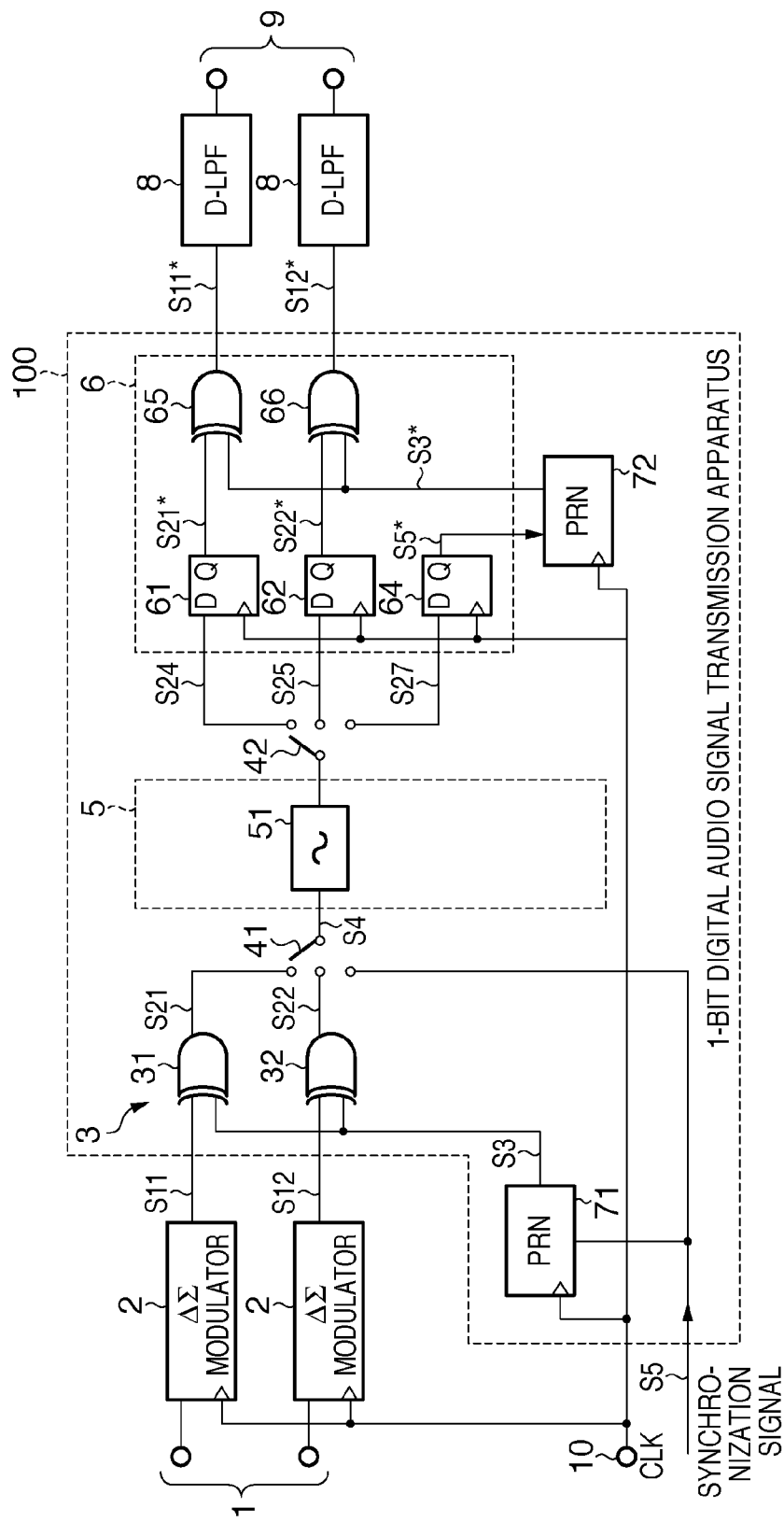
FIG. 10 is a diagram showing an overall configuration of an audio signal processing system according to Variation 2 of Embodiment 2.

Next, Variation 2 of Embodiment 2 will be described with reference to FIG. 10. In variation 2, a first code generator 71 and a second code generator 72 are provided in the transmission source and transmission destination for multiplex signal S4. In this case, it is necessary to establish synchronization between the first code generator 71 and the second code generator 72. Accordingly, individual code-modulated signals S21 and S22 and a synchronization signal S5 are combined into a single stream by the parallel-to-serial converter 41, and output as a multiplex signal S4. The transmission line 51 transmits the multiplex signal S4. The serial-to-parallel converter 42 demultiplexes the multiplex signal S4 into individual code-modulated signals S24 and S25 and a synchronization signal S27. The code-modulated signals S24 and S25 and synchronization signal S27 are latched by D-latches 61, 62 and 64 in synchronization with the leading edge of the clock pulse to obtain code-modulated signals S21* and S22* and a synchronization signal S5* that are synchronized with the clock pulse. An output S3* from the second code generator 72 that is in synchronization with the synchronization signal S5* and the code-modulated signals S21* and S22* are in phase with each other, and the signals are demodulated into 1-bit digital audio signals S11* and S12* by exclusive OR gates 65 and 66.

Figure 11:
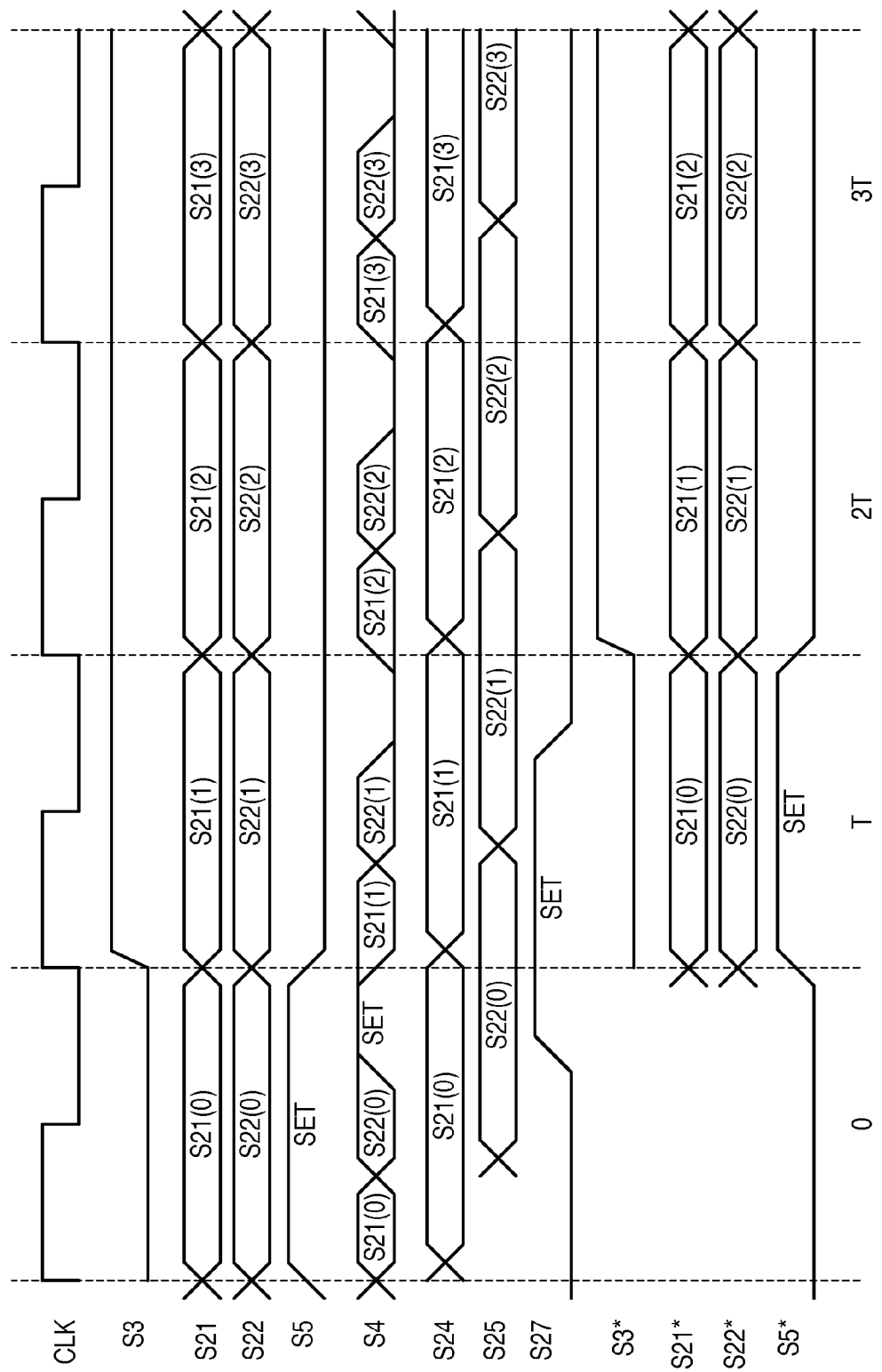
FIG. 11 is a timing diagram illustrating an operation of the audio signal processing system according to Variation 2 of Embodiment 2.

Next, the operation will be described in further detail with reference to the timing chart of FIG. 11. A multiplex signal S4 is obtained by sequentially selecting code-modulated signals S21 and S22 and a synchronization signal S5 that are in synchronization with the leading edge of the clock pulse. After transmission of the multiplex signal S4, a code-modulated signal S24 is obtained by latching in synchronization with a signal S21 included in the multiplex signal S4. Likewise, a code-modulated signal S25 and a synchronization signal S27 are obtained by latching in synchronization with each of a signal S22 and a synchronization signal S5 included in the multiplex signal S4. Furthermore, the signals S24, S25 and S27 are latched again in synchronization with the leading edge of the clock pulse to obtain code-modulated signals S21* and S22* and a synchronization signal S5* whose phases match each other. Furthermore, a pseudo-random noise pattern S3* is output by the code generator 72 to which the synchronization signal S5* has been input. At this time, the pseudo-random noise pattern S3* and the code-modulated signals S21* and S22* are in phase with each other. In Variation 2 as well, the transmission line 52 that transmits a pseudo-random noise pattern S3 is unnecessary, so it is possible to make the transmission line simpler.

Figure 12:
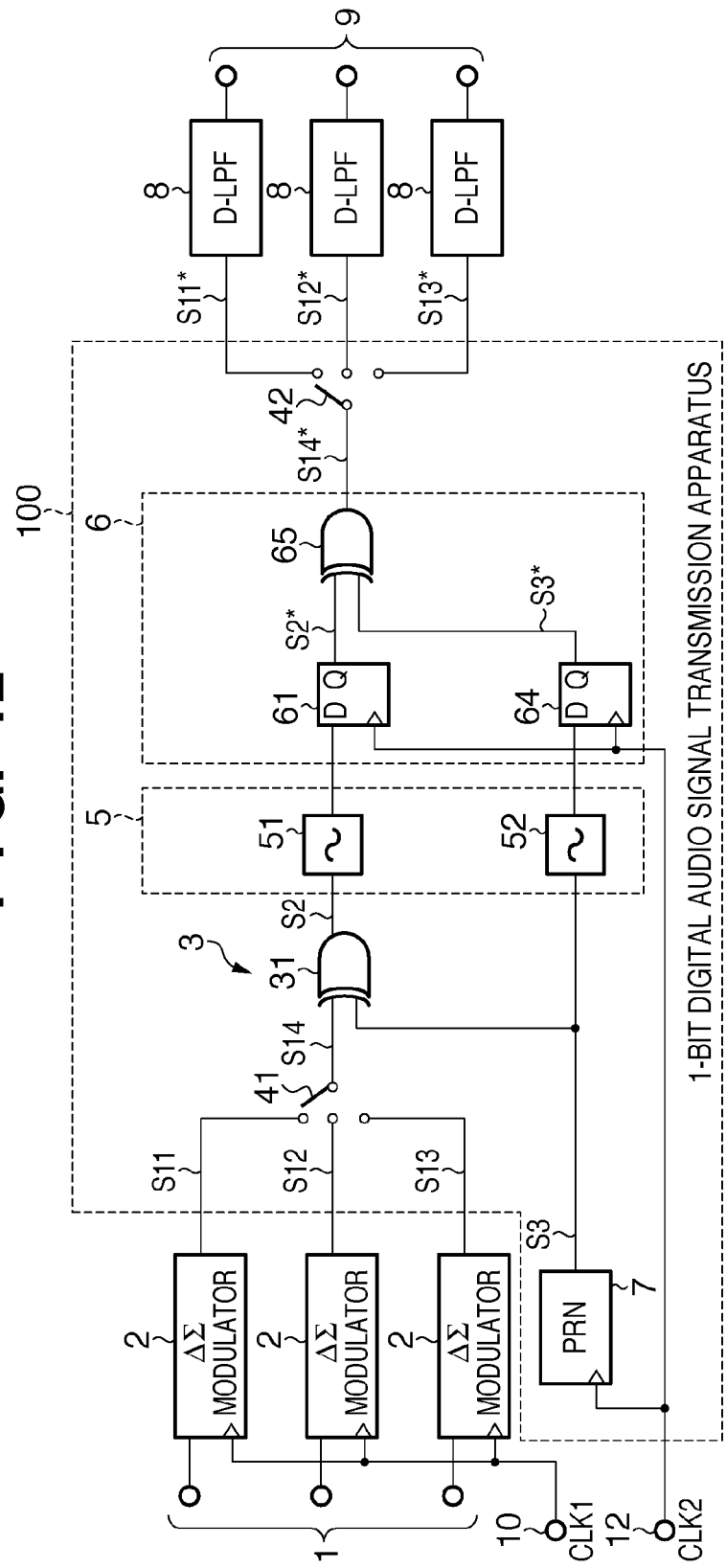
FIG. 12 is a diagram showing an overall configuration of an audio signal processing system according to Embodiment 3.

Next, a digital audio signal processing system according to Embodiment 3 will be described with reference to FIG. 12. Embodiment 3 is different from Embodiments 1 and 2 described above in that a plurality of 1-bit digital audio signals S11, S12 and S13 are multiplexed first, and then code-modulated and transmitted.

A clock CLK2 supplied by a clock input terminal 12 is a clock having a rate equal to the data rate of a code-modulated signal S2. A plurality of 1-bit digital audio signals S11, S12 and S13 are combined into a single stream by time division multiplexing, and output as a multiplex signal S14. Then, in the code modulator 3, the multiplex signal S14 and a pseudo-random noise pattern S3 are converted to a multiplex code-modulated signal S2 by the exclusive OR gate 31. The transmission line 51 transmits the multiplex code-modulated signal S2. The transmission line 52 transmits the pseudo-random noise pattern S3. The code demodulator 6 demodulates the multiplex code-modulated signal S2* latched in synchronization with the clock CLK2 to a multiplex signal S14*. The serial-to-parallel converter 42 converts the multiplex signal S14* into a plurality of 1-bit digital audio signals S11*, S12* and S13*.

Figure 13:
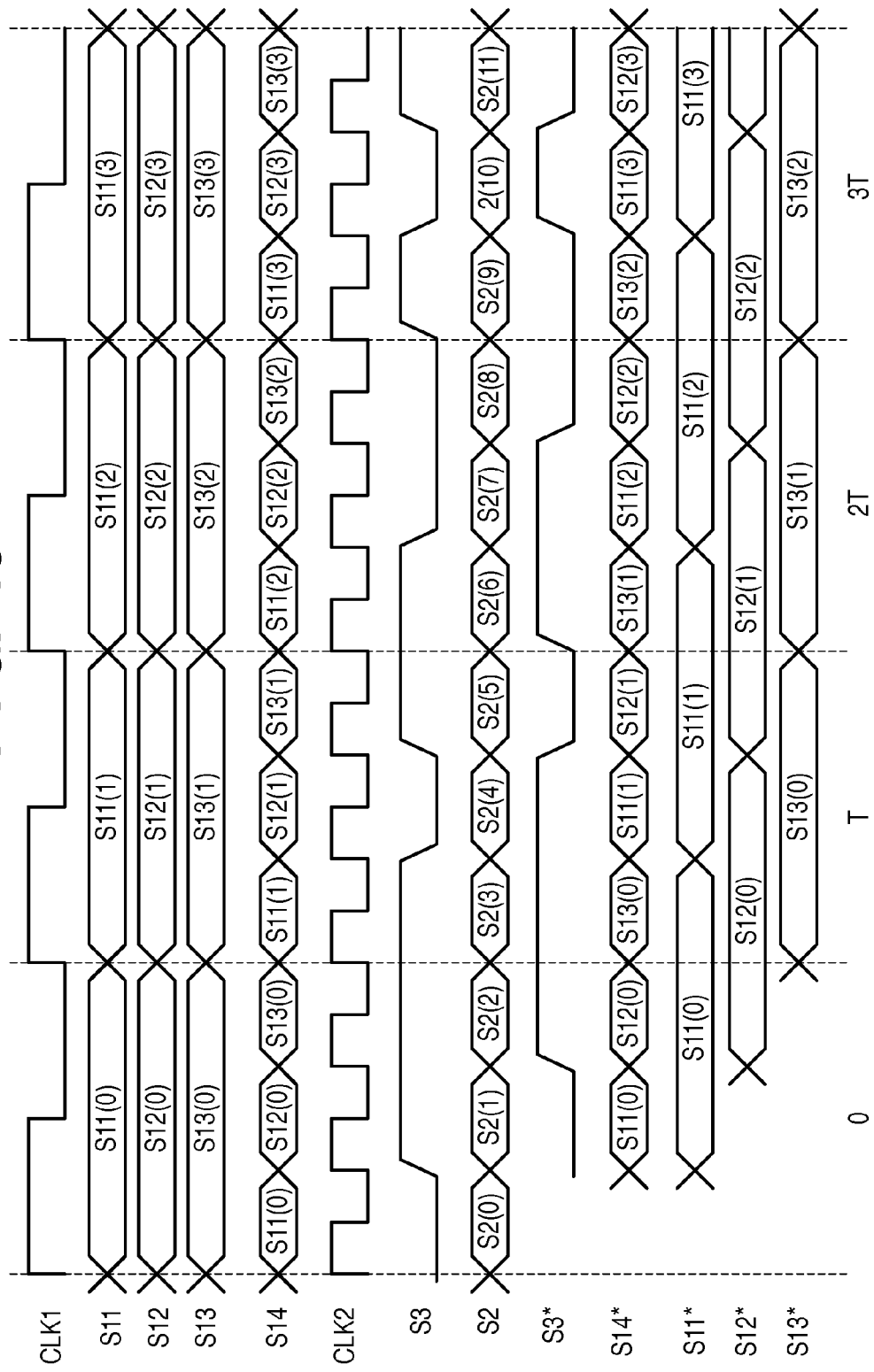
FIG. 13 is a timing diagram illustrating an operation of the audio signal processing system according to Embodiment 3.

Next, the operation will be described in further detail with reference to the timing chart of FIG. 13. A multiplex signal S14 is obtained by sequentially selecting 1-bit digital audio signals S11, S12 and S13 that are in synchronization with the leading edge of a clock CLK1 supplied from the clock input terminal 10. Next, a multiplex code-modulated signal S2 is obtained by using an exclusive OR of the multiplex signal S14 and a pseudo-random noise pattern S3. After transmission of the multiplex code-modulated signal S2 and the pseudo-random noise pattern S3, a multiplex code-modulated signal S2* and a pseudo-random noise pattern S3* that are in phase are obtained by latching in synchronization with the leading edge of the clock CLK2. Furthermore, by using an exclusive OR, a multiplex signal S14* is obtained. Then, a 1-bit digital audio signal S11* is obtained by latching in synchronization with a signal S11 included in the multiplex signal S14*. Likewise, signals S12* and S13* are obtained by latching in synchronization with signals S12 and S13 included in the multiplex signal S14*.

Embodiment 3 can be implemented by using only one code modulation circuit because a plurality of 1-bit digital audio signals are multiplexed in advance, and then code-modulated. Accordingly, the code modulator and the code demodulator can be made simpler.

It should be noted that the present invention is not limited to the embodiments that employ the above-described 1-bit digital audio signal transmission apparatus. In addition, the present invention is also applicable to cases where a 1-bit digital audio signal is transmitted and converted to an analog audio signal.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-125848, filed on May 25, 2009, which is hereby incorporated by reference herein in its entirety.

What is claimed is:

1. A signal transmission apparatus that transmits a 1-bit signal obtained by delta-sigma modulation comprising:
   a generation unit configured to generate a pseudo-random noise pattern having a data rate equal to that of the 1-bit signal;
   a code modulation unit configured to code-modulate the 1-bit signal using the pseudo-random noise pattern generated by the generation unit;
   a transmission unit configured to transmit the pseudo-random noise pattern generated by the generation unit and the code-modulated signal obtained by the code modulation unit; and
   a code demodulation unit configured to demodulate the code-modulated signal transmitted by the transmission unit, using the pseudo-random noise pattern transmitted by the transmission unit.

2. The signal transmission apparatus according to claim 1, wherein the code modulation unit comprises a first logical operation unit configured to output an exclusive OR of the pseudo-random noise pattern generated by the generation unit and the 1-bit signal as a code-modulated signal, and
   the code demodulation unit comprises a second logical operation unit configured to output an exclusive OR of the code-modulated signal transmitted by the transmission unit and the pseudo-random noise pattern transmitted by the transmission unit.

3. The signal transmission apparatus according to claim 1, further comprising:
   a plurality of the code modulation units that are arranged in parallel to each other; and
   a multiplex unit that is provided between the plurality of code modulation units and the transmission unit, and that is configured to multiplex code-modulated signals that are output by the plurality of code modulation units and to output the resultant signal to the transmission unit.

4. The signal transmission apparatus according to claim 1, wherein the multiplex unit is configured to multiplex the code-modulated signals that are output by the code modulation units and the pseudo-random noise pattern generated by the generation unit and to output the resultant signal to the transmission unit.

5. A signal transmission apparatus that transmits a 1-bit signal obtained by delta-sigma modulation comprising:
   a first generation unit configured to generate a pseudo-random noise pattern having a data rate equal to that of the 1-bit signal based on an input synchronization signal;
   a plurality of code modulation units configured to code-modulate a plurality of 1-bit signals obtained by delta-sigma modulation in parallel, using the pseudo-random noise pattern generated by the first generation unit;
   a multiplex unit configured to multiplex the code-modulated signals output by the plurality of code modulation units and the synchronization signal and to output the resultant signal;
   a transmission unit configured to transmit the code-modulated signals and the synchronization signal that have been output via the multiplex unit;
   a separation unit configured to demultiplex the code-modulated signals and the synchronization signal that have been transmitted by the transmission unit into individual code-modulated signals and a synchronization signal;
   a second generation unit configured to generate a pseudo-random noise pattern having a data rate equal to that of the 1-bit signal based on the synchronization signal obtained by the separation unit; and a code demodulation unit configured to demodulate the code-modulated signals obtained by the separation unit, using the pseudo-random noise pattern generated by the second generation unit.

6. The signal transmission apparatus according to claim 5, wherein each of the code modulation unit units comprises a first logical operation unit configured to output an exclusive OR of the pseudo-random noise pattern generated by the first generation unit and the 1-bit signal as a code-modulated signal, and the code demodulation unit comprises a second logical operation unit configured to output an exclusive OR of the code-modulated signal transmitted by the transmission unit and the pseudo-random noise pattern transmitted generated by the transmission second generation unit.

7. A signal transmission apparatus that transmits a 1-bit signal obtained by delta-sigma modulation comprising:

a generation unit configured to generate a pseudo-random noise pattern having a data rate equal to that of the 1-bit signal;

a multiplex unit configured to multiplex a plurality of 1-bit signals obtained by delta-sigma modulation and output the resultant signal;

a code modulation unit configured to code-modulate the plurality of 1-bit signals that are output via the multiplex unit, using the pseudo-random noise pattern generated by the generation unit and output as a code-modulated signal;

a transmission unit configured to transmit the pseudo-random noise pattern generated by the generation unit and the code-modulated signal obtained by the code modulation unit;

a code demodulation unit configured to demodulate the code-modulated signal transmitted by the transmission unit, using the pseudo-random noise pattern transmitted by the transmission unit; and a separation unit configured to demultiplex the multiplex signal demodulated by the code demodulation unit into individual 1-bit signals.

8. A signal reception apparatus comprising:

a reception unit configured to receive a pseudo-random noise pattern and a code-modulated signal transmitted by a signal transmission apparatus that transmits a 1-bit signal obtained by delta-sigma modulation via a transmission line; and a first code demodulation unit configured to demodulate the code-modulated signal received by the reception unit, using the pseudo-random noise pattern received by the reception unit, wherein the signal transmission apparatus includes:

a generation unit configured to generate the pseudo-random noise pattern having a data rate equal to that of the 1-bit signal;

a code modulation unit configured to code-modulate the 1-bit signal using the pseudo-random noise pattern generated by the generation unit;

a transmission unit configured to transmit the pseudo-random noise pattern generated by the generation unit and the code-modulated signal obtained by the code modulation unit; and a second code demodulation unit configured to demodulate the code-modulated signal transmitted by the transmission unit, using the pseudo-random noise pattern transmitted by the transmission unit.

9. A signal transmission apparatus that transmits a 1-bit signal obtained by delta-sigma modulation, the apparatus comprising:

a generation unit configured to generate a pseudo-random noise pattern having a data rate equal to that of the 1-bit signal based on an input synchronization signal;

a plurality of code modulation units configured to code-modulate a plurality of 1-bit signals obtained by delta-sigma modulation in parallel, using the pseudo-random noise pattern generated by the generation unit; and a multiplex unit configured to multiplex the code-modulated signals output by the plurality of code modulation units and the synchronization signal and to output the resultant signal.

10. A signal reception apparatus comprising:

a reception unit configured to receive a multiplex signal transmitted by a signal transmission apparatus that transmits a 1-bit signal obtained by delta-sigma modulation via a transmission line;

a separation unit configured to demultiplex the multiplex signal transmitted via the transmission line into a plurality of individual code-modulated signals and a synchronization signal;

a first generation unit configured to generate a pseudo-random noise pattern having a data rate equal to that of the 1-bit signal based on the synchronization signal obtained by the separation unit; and a code demodulation unit configured to demodulate the plurality of individual code-modulated signals obtained by the separation unit, using the pseudo-random noise pattern generated by the first generation unit, wherein the signal transmission apparatus includes:

a second generation unit configured to generate the pseudo-random noise pattern having a data rate equal to that of the 1-bit signal based on an input synchronization signal;

a plurality of code modulation units configured to code-modulate a plurality of 1-bit signals obtained by delta-sigma modulation in parallel, using the pseudo-random noise pattern generated by the second generation unit; and a multiplex unit configured to multiplex the code-modulated signals output by the plurality of code modulation units and the synchronization signal and to output the resultant signal.

11. A signal transmission apparatus that transmits a 1-bit signal obtained by delta-sigma modulation, the apparatus comprising:

a generation unit configured to generate a pseudo-random noise pattern having a data rate equal to that of the 1-bit signal;

a multiplex unit configured to multiplex a plurality of 1-bit signals obtained by delta-sigma modulation and output the resultant signal; and a code modulation unit configured to code-modulate the plurality of 1-bit signals that are output via the multiplex unit, using the pseudo-random noise pattern generated by the generation unit and output as a code-modulated signal.

12. A signal reception apparatus comprising:

a reception unit configured to receive a pseudo-random noise pattern and a code-modulated signal transmitted by a signal transmission apparatus that transmits a 1-bit signal obtained by delta-sigma modulation via a transmission line;

a first code demodulation unit configured to demodulate the code-modulated signal received by the reception unit, using the pseudo-random noise pattern received by the reception unit; and a separation unit configured to demultiplex a multiplex signal demodulated by the first code demodulation unit into a plurality of individual 1-bit signals, wherein the signal transmission apparatus includes:

a generation unit configured to generate the pseudo-random noise pattern having a data rate equal to that of the 1-bit signal;

a multiplex unit configured to multiplex a plurality of 1-bit signals obtained by delta-sigma modulation and output the resultant signal; and a second code modulation unit configured to code-modulate the plurality of 1-bit signals that are output via the multiplex unit, using the pseudo-random noise pattern generated by the generation unit and output as the code-modulated signal.

* * * * *